United States Patent [19]

Campbell, Jr. et al.

[11] Patent Number: 5,646,550

[45] Date of Patent: Jul. 8, 1997

[54] HIGH RELIABILITY OUTPUT BUFFER FOR MULTIPLE VOLTAGE SYSTEM

[75] Inventors: Jules D. Campbell, Jr.; Rene M. Delgado; Steve Lim, all of Austin, Tex.

[73] Assignee: Motorola, Inc., Schaumburg, Ill.

[21] Appl. No.: 605,422

[22] Filed: Feb. 22, 1996

[51] Int. Cl.[6] .............................................. H03K 19/0185
[52] U.S. Cl. .................. 326/81; 326/21; 326/58; 326/121
[58] Field of Search .................. 326/21, 56–58, 326/80–81, 121

[56] References Cited

U.S. PATENT DOCUMENTS

| | | | |
|---|---|---|---|
| 4,954,729 | 9/1990 | Urai | 307/443 |
| 5,160,855 | 11/1992 | Dobberpuhl | 307/270 |
| 5,266,849 | 11/1993 | Kitahara et al. | 307/475 |
| 5,338,978 | 8/1994 | Larsen et al. | 307/443 |
| 5,396,128 | 3/1995 | Dunning et al. | 326/68 |
| 5,467,031 | 11/1995 | Nguyen et al. | 326/81 |
| 5,543,733 | 8/1996 | Mattos et al. | 326/81 |
| 5,546,019 | 8/1996 | Liao | 326/21 X |
| 5,565,794 | 10/1996 | Porter | 326/81 |

*Primary Examiner*—David R. Hudspeth
*Attorney, Agent, or Firm*—Paul J. Polansky

[57] ABSTRACT

An output buffer (30) is connected to an output signal line and receives an internal power supply voltage, for example 3.3 volts, which is lower than a voltage, for example 5 volts, that other devices which may be connected to the output signal line are able to drive. To protect an output transistor (71) from the harmful effects of the higher voltages on the output signal line, the output buffer (30) includes a special bulk biasing circuit (80). The bulk biasing circuit (80) biases the bulk of the output transistor (71) at an internal power supply voltage when the output buffer is driving and when not driving to a voltage determined by the output signal. To prevent overlap currents, the output buffer (30) includes a special gate biasing circuit (100), which momentarily drives the gate of the output transistor (71) to a voltage equal to the internal power supply voltage when the output buffer (30) stops driving.

10 Claims, 5 Drawing Sheets

HIGH RELIABILITY OUTPUT BUFFER FOR MULTIPLE VOLTAGE SYSTEM

FIELD OF THE INVENTION

This invention relates generally to output buffers, and more particularly to output buffers for use in multiple voltage systems.

BACKGROUND OF THE INVENTION

Many integrated circuits today are manufactured using metal-oxide-semiconductor (MOS) and complementary metal-oxide-semiconductor (CMOS) transistor technology. CMOS circuits allow the integration of many transistors into a small area, and offer relatively low power consumption. These features make CMOS technology the technology of choice for such products as microprocessors, microcontrollers, memories, telecommunication circuits, and analog and digital audio circuits.

For quite some time, CMOS circuits have operated using a single five-volt power supply. The five-volt supply has been more than adequate to ensure enough headroom for signal amplifiers, sense amplifiers, and digital logic. Due to the trend toward higher-density logic circuits which are subject to voltage scaling because of transistor geometry changes, such as reduced gate oxide thickness, there is a trend toward lower supply voltages. For CMOS circuits, the lower power supply voltage may be only, for example, 3.3 volts. While some integrated circuits have been designed to operate with this reduced power supply voltage, other circuits continue to require the conventional 5-volt supply. This creates compatibility problems. For example, a microcontroller designed to operate with a 3.3-volt supply may be connected to a bus which also is capable of conducting signals from 5-volt devices. Thus, output buffer circuits designed for operation at a reduced power supply voltage need to be able to interface with devices at the higher power supply voltage.

Figure 1:
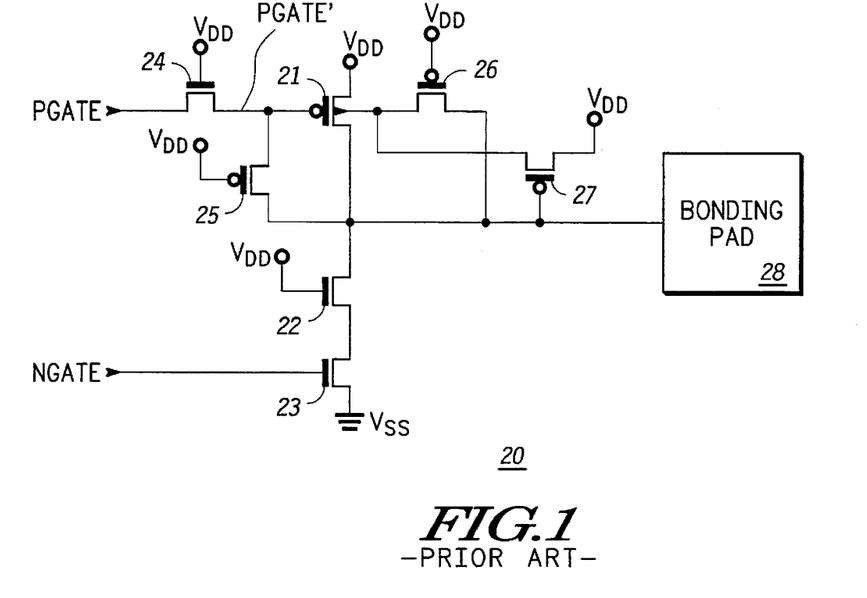
FIG. 1 illustrates in partial block diagram and partial schematic form an output buffer circuit according to the prior art.

Exposure to these higher power supply voltages can cause several compatibility problems for the reduced voltage output buffer. FIG. 1 illustrates in partial block diagram and partial schematic form an output buffer circuit 20 according to the prior art, which attempts to solve these problems. Output buffer circuit 20 includes a P-channel MOS transistor 21, N-channel MOS transistors 22–24, P-channel transistors 25–27, and a bonding pad 28. Transistor 21 has a source connected to a power supply voltage terminal labelled "$V_{DD}$", a gate, a drain connected to bonding pad 28, and a bulk electrode. $V_{DD}$ is a more-positive power supply voltage terminal which has a nominal value of approximately 3.3 volts. Transistor 22 has a drain connected to the drain of transistor 21, a gate connected to $V_{DD}$, and a source. Transistor 23 has a drain connected to the source of transistor 22, a gate for receiving a signal labelled "NGATE", and a source connected to a power supply voltage terminal labelled "VSS". $V_{SS}$ is a more-negative power supply voltage terminal which functions as the common or ground power supply voltage terminal and has a nominal value of 0 volts. Transistor 24 has a first current electrode for receiving a signal labelled "PGATE", a gate connected to $V_{DD}$, and a second current electrode connected to the gate of transistor 21. Transistor 25 has a first current electrode connected to the drain of transistor 21, a gate connected to $V_{DD}$, and a second current electrode connected to the gate of transistor 21. Transistor 26 has a source connected to the drain of transistor 21, a gate connected to $V_{DD}$, and a drain connected to the bulk electrode of transistor 21. Transistor 27 has a source connected to $V_{DD}$, a gate connected to bonding pad 28, and a drain connected to the bulk electrode of transistor 21.

Transistor 21 forms the pullup side and transistor 23 forms the pulldown side of output buffer 20. Output buffer 20 includes several features which allow it to operate reliably in systems in which another device is capable of driving the signal on bonding pad 28 to a voltage higher than $V_{DD}$, such as 5 volts when $V_{DD}$ is 3.3 volts. First cascode transistor 22 protects transistor 23 from the high voltages on bonding pad 28, which prevents a full 5 volts from appearing between the drain and gate. Second, transistor 25 prevents a high voltage on bonding pad 28 from causing transistor 21 to conduct to discharge the voltage on bonding pad 28 into $V_{DD}$. Transistor 25 becomes conductive when the voltage on bonding pad 28 exceeds $V_{DD}$ by more than the threshold voltage of transistor 25, designated generally as "$V_{TP}$". Third, since the gate of transistor 21 may become biased above $V_{DD}$, transistor 24 serves as a pass transistor to isolate the internal circuitry driving signal PGATE from the excessive voltage. Fourth, the bulk of transistor 21 is biased using a "switched well" technique. When the voltage on bonding pad 28 is at 5 volts, transistor 26 becomes conductive and biases the well to approximately 5 volts. Otherwise when the voltage on bonding pad 28 is a logic low, transistor 27 becomes conductive to bias the bulk of transistor 21 to $V_{DD}$.

Despite these protections, however, output buffer 20 creates two new problems which need to be addressed. First, there is a "deadband" of voltage of bonding pad 28, around which the bulk of transistor 21 becomes "floating" (unbiased). This deadband occurs in the range of $V_{DD} \pm V_{TP}$, or more precisely, between $V_{DD}-V_{TP27}$ and $V_{DD}+V_{TP26}$, where $V_{TP27}$ is the $V_{TP}$ of transistor 27 and $V_{TP26}$ is the $V_{TP}$ of transistor 26. It is generally desirable to prevent any node from floating, or from having excessive voltage across the gate dielectric. This electrical overstress (EOS) causes Fowler-Nordheim tunneling, which over time reduces the threshold of transistor 21 and eventually results in circuit failure when transistor 21 is no longer capable of being fully conductive.

Second, when output buffer 20 is driving, signal PGATE causes transistor 21 to be conductive or not, depending on the data value to be driven. If signal PGATE is at a logic low, then the voltage on the gate of transistor 21 is at a logic low and is at approximately the same voltage as signal PGATE. However, if signal PGATE is at a logic high, then the voltage on transistor 21 is at $V_{DD}-V_{TN}$, where $V_{TN}$ represents in general the threshold of an N-channel transistor. If output buffer 20 stops driving when the voltage on the gate of transistor 21 is at $V_{DD}-V_{TN}$ and an external device connected to bonding pad 28 drives a logic high of 5 volts, then there is no problem. Transistor 25 becomes conductive and drives 5 volts onto the gate of transistor 21. However, a problem occurs if output buffer 20 stops driving when the voltage on the gate of transistor 21 is at $V_{DD}-V_{TN}$ and an external device connected to bonding pad 28 drives a logic low. In this case transistor 25 does not become conductive, and the voltage of $V_{DD}-V_{TN}$ remains on the gate of transistor 21. This causes transistor 21 to operate near its threshold, and to be somewhat conductive. Transistor 21 then "leaks" and fights the logic low driven by the external device. This leakage can cause radiated interference, increase power consumption, and affect signal timing by slowing the fall time of the signal on bonding pad 28.

Figure 7:
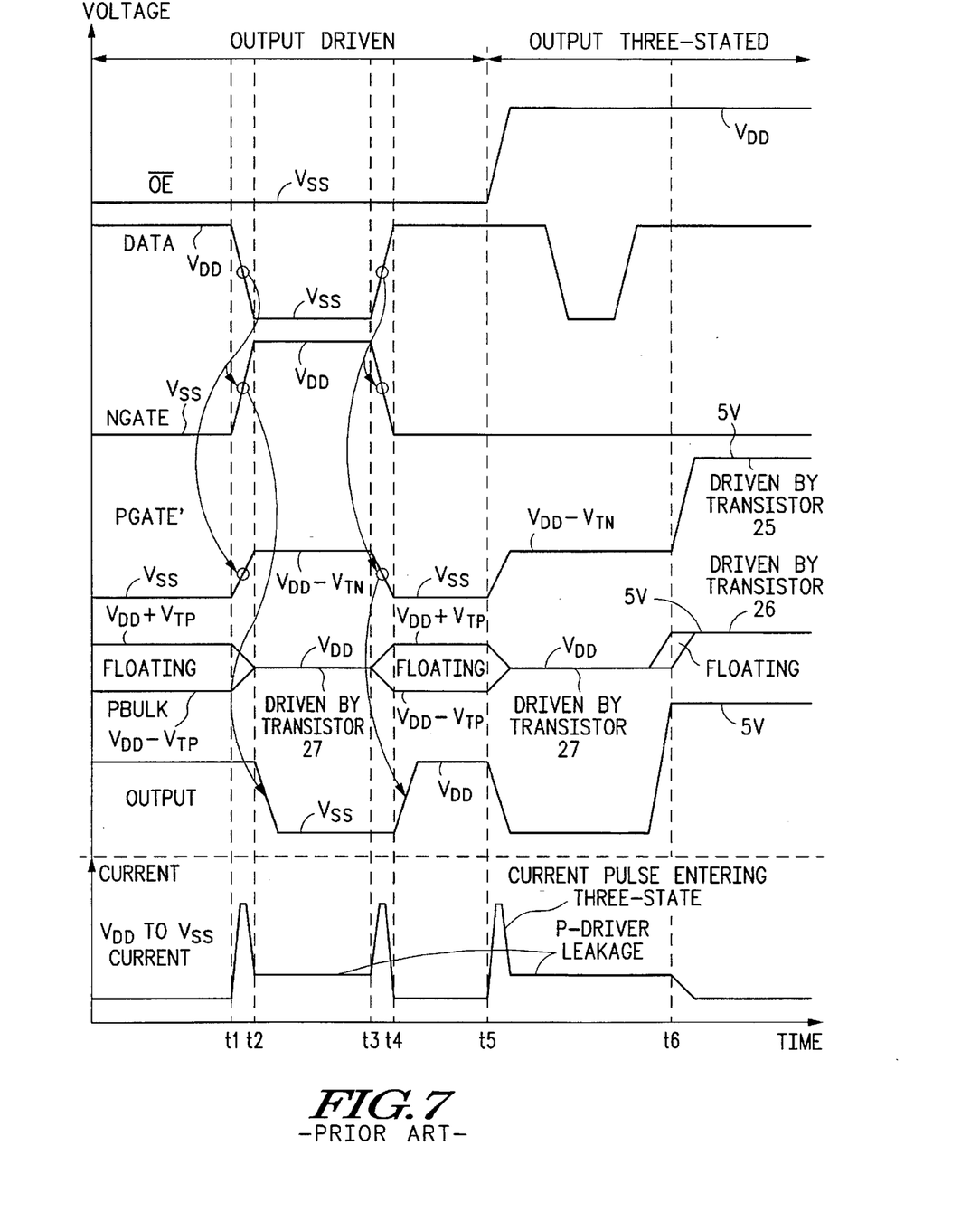
FIG. 7 illustrates a timing diagram useful in understanding the operation of the prior art output buffer of FIG. 1.

These problems can be better understood with reference to FIG. 7, which illustrates a timing diagram useful in understanding the operation of output buffer 20 of FIG. 1.

For all signals, the horizontal axis represents time, and approximate time points of interest are designated along the horizontal axis. For all but one signal, the vertical axis represents voltage. For the one additional signal, the vertical axis represents current. Since output buffer 20 is a CMOS output buffer, a logic high voltage is approximately equal to $V_{DD}$ and a logic low voltage is approximately $V_{SS}$. FIG. 7 labels these voltages where useful in understanding the operation of output buffer 20.

FIG. 7 illustrates two relevant time periods. During a first time period which represents the period on the time axis up to time point t5, signal OUTPUT is driven by output buffer 20 which is in an enabled condition, as indicated by a signal labelled "$\overline{OE}$" being active at a logic low. After time point t5, signal $\overline{OE}$ transitions to a logic high, thereby causing output buffer 20 to enter a three-state condition, whereupon external circuitry may drive signal OUTPUT.

At time point t1, signal DATA transitions from a logic high to a logic low. This transition causes both signals NGATE and PGATE' to transition to a logic high. Note however that the logic high level of signal PGATE' is not a full CMOS logic level, and is at substantially $(V_{DD}-V_{TN})$. Note that signal PBULK was floating prior to time t1, and is driven to substantially $V_{DD}$ at time t2 by transistor 27. Signal OUTPUT transitions to a logic low by the activation of signal NGATE at time t2. Note the significant $V_{DD}$-to-$V_{SS}$ current pulse which is caused by overlap current in transistors 21 and 23.

At time point t3, signal DATA transitions to a logic high. This transition causes both signals NGATE and PGATE' to transition to a logic low. Signal PGATE' returns to a full CMOS logic low level, and signal PBULK again is floating. Signal OUTPUT transitions to a logic high by the activation of signal PGATE' at time t4. Again there is a significant $V_{DD}$-to-$V_{SS}$ current pulse caused by the overlap current in transistors 21 and 23.

At time point t5, signal $\overline{OE}$ transitions to a logic high, which causes signal NGATE to be inactive at a logic low and signal PGATE' to be inactive at a logic high regardless of the state of DATA, which causes output buffer 20 to be in a three-state condition. Again signal PGATE' is at substantially $(V_{DD}-V_{TN})$, thereby causing transistor 21 to remain partially conductive. Thus, if an external circuit causes signal OUTPUT to transition to a logic low, there is a further $V_{DD}$-to-$V_{SS}$ current pulse when output buffer 20 enters three-state. Furthermore, there is constant leakage through transistor 21 between the current pulses. Signal PBULK is driven to a voltage of $V_{DD}$ by transistor 27.

At time point t6, signal OUTPUT transitions to a voltage above $V_{DD}$, such as 5 volts in the illustrated example. This high voltage level is coupled to signal PGATE' by transistor 25. Once the gate of transistor 21 reaches this voltage, transistor 21 is no longer conductive, eliminating the $V_{DD}$-to-$V_{SS}$ leakage current. Signal PBULK is likewise coupled to signal OUTPUT by transistor 26.

In light of these situations in which signal PBULK is floating and in which $V_{DD}$-to-$V_{SS}$ current pulses occur, what is needed is an output buffer for integrated circuits which can operate reliably at a reduced power supply voltage when other devices are capable of driving the output signal line to a voltage exceeding the on-chip power supply voltage, and can also reduce or eliminate the overlap current in the output stage. The present invention provides such an output buffer, whose features and advantages will be more clearly understood when the attached description is taken in conjunction with the accompanying drawings.

DETAILED DESCRIPTION OF A PREFERRED EMBODIMENT

An output buffer according to the present invention works with a reduced internal power supply voltage while allowing compatibility with other devices in the system which operate with a larger power supply voltage. The output buffer includes a special bulk biasing circuit which biases the bulk or well of the pullup transistor such that when the buffer is driving, regardless of the logic level, the well is coupled to the internal power supply voltage, and when the buffer is not driving, the well is coupled to either the internal power supply voltage or to the output signal line according to the voltage level on the output signal line. This output buffer also reduces the overlap current in the output stage by including a special gate biasing circuit. The gate biasing circuit recognizes a transition from the driving to the not driving state and momentarily charges the gate of the pullup transistor to the internal power supply voltage level, thus biasing it into a strongly nonconductive state when not driving. The reduction in overlap current caused thereby results in lower overall power consumption, lower radiated noise, and better signal timing performance.

In the following description, an "active high" signal is considered to be active or true at a logic high voltage, and an "active low" signal is considered to be active or true at a logic low voltage. The illustrated output buffer uses CMOS transistors in the output stage, and the designation of "source" and "drain" depends on the voltages applied. Where appropriate, "source" is used to mean the current electrode which is normally connected to the corresponding supply voltage, and "drain" is used to mean the current electrode which provides the output current. When different voltages are applied, the designation of "source" and "drain" terminals may reverse. When neither terminal is normally the source or the drain, they are simply referred to as current electrodes. Note that in addition to source, gate, and drain, CMOS transistors also have a bulk electrode. Note that the bulk electrode of a transistor may be the integrated circuit substrate if the channel of the transistor is formed in the substrate, or it may be a well which itself is formed in the integrated circuit substrate, or even a well within another well. If the bulk electrode of a transistor is not specifically described, then it is connected in a conventional manner. Typically, the bulk of a P-channel transistor is connected to the positive power supply voltage, and the bulk of an N-channel transistor is connected to the negative power supply voltage. Also as should be apparent the techniques used for the illustrated output buffer are applicable to other types of transistors in which an inversion layer forms a conductive channel of one conductivity type in a bulk or well of the opposite conductivity type.

Figure 2:
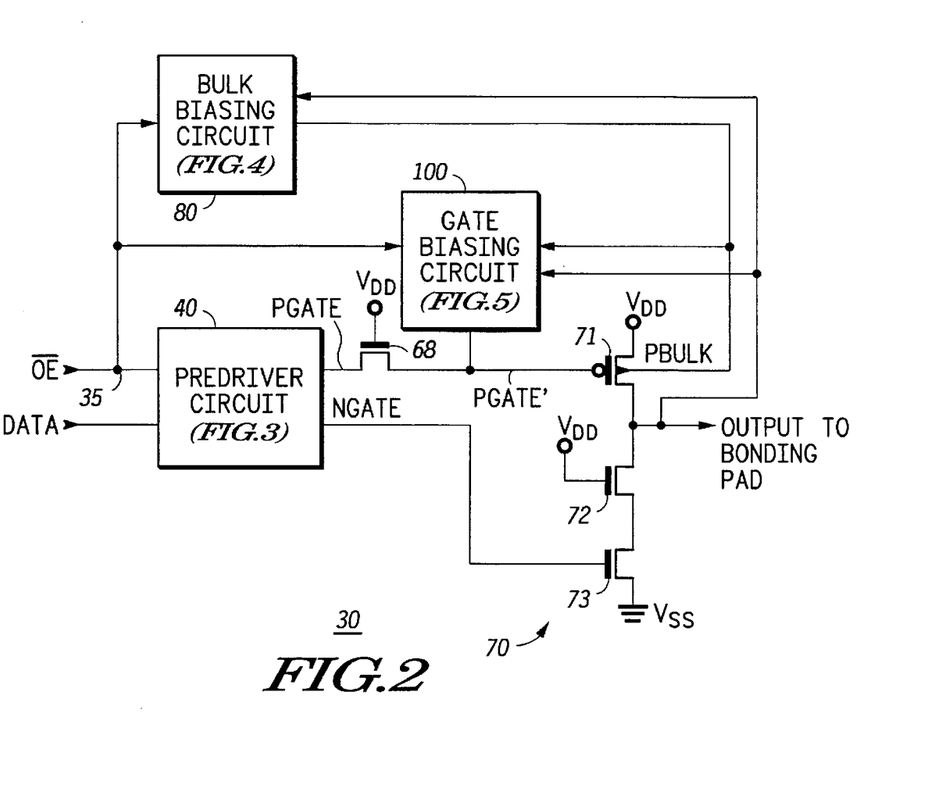
FIG. 2 illustrates in partial block diagram and partial schematic form an output buffer according to the present invention.

FIG. 2 illustrates in partial block diagram and partial schematic form an output buffer 30 according to the present invention. Output buffer 30 includes an enable input terminal 35, a predriver circuit 40, an N-channel transistor 68, an output stage 70, a bulk biasing circuit 80, and a gate biasing circuit 100. Enable input terminal 35 receives an input signal labelled "$\overline{OE}$". Predriver circuit 40 has a data terminal for receiving a data input signal labelled "DATA", a control input terminal for receiving signal $\overline{OE}$, a first output terminal for providing signal PGATE, and a second output terminal for providing signal NGATE. Predriver circuit 40 may be any conventional three state predriver circuit. When signal $\overline{OE}$ is inactive, predriver circuit 40 provides signal PGATE inactive at a logic high and signal NGATE inactive at a logic low. When signal $\overline{OE}$ is active, predriver circuit 40 provides signals PGATE and NGATE in a complementary logic state to signal DATA. Transistor 68 has a first current electrode connected to the first output terminal of predriver circuit 40, a second current electrode, and a gate coupled to $V_{DD}$.

Output stage 70 includes a P-channel transistor 71 and N-channel transistors 72 and 73. Transistor 71 has a source connected to $V_{DD}$, a gate coupled to the first output terminal of predriver circuit 40 through pass transistor 68, a drain for providing a signal labelled "OUTPUT", and a bulk electrode for receiving a signal labelled "PBULK". Signal OUTPUT is the output signal provided by output buffer 30 to an integrated circuit bonding pad, not shown. Transistor 73 has a drain, a gate for receiving signal NGATE, and a source connected to $V_{SS}$. Transistor 72 is a cascode device for coupling signal OUTPUT at the drain of transistor 71 to the drain of transistor 73 and preventing a large external voltage from appearing on the drain of transistor 73, and has a drain connected to the drain of transistor 71, a gate connected to $V_{DD}$, and a source connected to the drain of transistor 73.

In order to prevent deleterious effects when other devices in the system drive signal OUTPUT at extended voltage levels, output buffer 30 includes two special circuits. The first special circuit is bulk biasing circuit 80. Bulk biasing circuit 80 has a first input terminal for receiving signal $\overline{OE}$, a second input terminal for receiving signal OUTPUT, and an output terminal for providing signal PBULK. Bulk biasing circuit 80 avoids the deadbands in voltage of signal OUTPUT by driving signal PBULK to a value of $V_{DD}$ when output buffer 30 is driving, i.e., when signal $\overline{OE}$ is active.

The second special circuit is gate biasing circuit 100. Gate biasing circuit 100 has a first input terminal connected to enable input terminal 35, a second input terminal for receiving signal PBULK, a third input terminal for receiving signal OUTPUT, and an output terminal connected to the gate of transistor 71. Gate biasing circuit 100 more reliably biases the gate of transistor 71 by sensing a transition of signal $\overline{OE}$ from active to inactive, and momentarily couples the gate of transistor 71 to $V_{DD}$ in response.

The actual circuits which are used to implement these function are detailed in FIGS. 3-6 below. However it will be readily appreciated by those skilled in the art that different circuits may be used to accomplish these functions.

Figure 3:
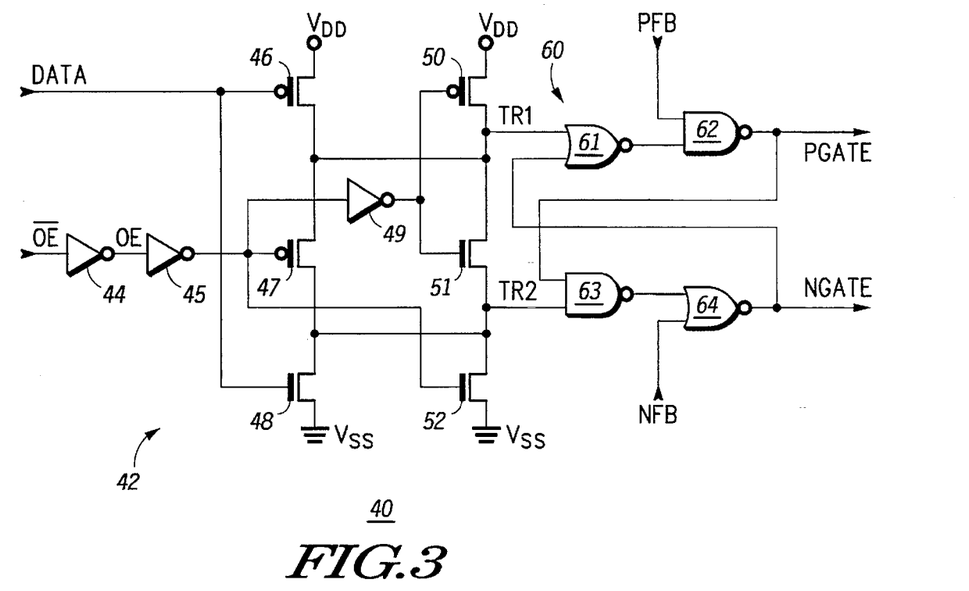
FIG. 3 illustrates in partial logic diagram and partial schematic form the predriver circuit of FIG. 2.

FIG. 3 illustrates in partial logic diagram and partial schematic form predriver circuit 40 of FIG. 2. Predriver circuit 40 includes generally a three-state control circuit 42, and a non-overlapping control circuit 60. Three-state control circuit 42 includes inverters 44 and 45, P-channel transistors 46 and 47, an N-channel transistor 48, an inverter 49, a P-channel transistor 50, and N-channel transistors 51 and 52. Inverter 44 has an input terminal for receiving signal $\overline{OE}$, and an output terminal for providing a signal labelled "OE". Inverter 45 has an input terminal connected to the output terminal of inverter 44, and an output terminal. Transistor 46 has a source connected to $V_{DD}$, a gate for receiving signal DATA, and a drain. Transistor 47 has a source connected to the drain of transistor 46, a gate connected to the output terminal of inverter 45, and a drain. Transistor 48 has a drain connected to the drain of transistor 47, a gate for receiving signal DATA, and a source connected to $V_{SS}$. Inverter 49 has an input terminal connected to the output terminal of inverter 45, and an output terminal. Transistor 50 has a source connected to $V_{DD}$, a gate connected to the output terminal of inverter 49, and a drain for providing a signal labelled "TR1". Transistor 51 has a drain connected to the drain of transistor 50, a gate connected to the output terminal of inverter 49, and a source. Transistor 52 has a drain connected to the source of transistor 51 and to the drain of transistor 48 for providing a signal labelled "TR2" thereon, a gate connected to the output terminal of inverter 45, and a source connected to $V_{SS}$.

Non-overlapping control circuit 60 includes a NOR gate 61, NAND gates 62 and 63, and a NOR gate 64. NOR gate 61 has a first input terminal connected to the drain of transistor 50, a second input terminal, and an output terminal. NAND gate 62 has a first input terminal for receiving a signal labelled "PFB", a second input terminal connected to the output terminal of NOR gate 61, and an output terminal. NAND gate 63 has a first input terminal connected to the output terminal of NAND gate 62, a second input terminal connected to the drain of transistor 52, and an output terminal. NOR gate 64 has a first input terminal connected to the output terminal of NAND gate 63, a second input terminal for receiving signal labelled "NFB", and an output terminal for providing signal NGATE and connected to the second input terminal of NOR gate 61.

In operation, three-state control circuit 42 receives input signals DATA and $\overline{OE}$, and provides signals TR1 and TR2 as outputs. Inverter 44 once inverts signal $\overline{OE}$ to provide signal OE, which is the signal actually used as a control input to bulk biasing circuit 80. Thus inverter 44 may be considered to be shared between predriver circuit 40 and bulk biasing circuit 80. Signal $\overline{OE}$ functions as an enable input signal to three-state control circuit 42 such that when signal $\overline{OE}$ is active at a logic low, three-state control circuit 42 provides signals TR1 and TR2 at a logic state opposite to that of signal DATA and when signal $\overline{OE}$ is inactive at a logic high, three-state control circuit provides signal TR1 at a logic high state and signal TR2 at a logic low state.

Non-overlapping control circuit 60 helps make signals PGATE and NGATE nonoverlapping because before signal NGATE can switch to its active logic state at a logic high, signal PGATE must be inactive at a logic high. Also, before signal PGATE can switch to its active logic state at a logic low, signal NGATE must be inactive at a logic low. Signals PFB and NFB are used to perform a current limiting function for variations in the conduction of the output transistors caused by variations in process, voltage, and temperature. They are generated in the output stage when an appreciable amount of current is flowing in the output stage from $V_{DD}$ or to $V_{SS}$, respectively. The mechanism by which these signals are generated will be explained in further detail in conjunction with the description of FIG. 6 below.

Note that in other applications in which speed is important, three-state control circuit 42 could be eliminated, speeding the delay time from signals $\overline{OE}$ and DATA valid to signals PGATE and NGATE valid. In this case, NOR gate 61 and NAND gate 63 would become three-input logic gates. Both gates would receive signals $\overline{OE}$ and DATA, at appropriate logic levels, as well as the respective PGATE and NGATE feedback signals. Since predriver circuit 40 would not generate signals TR1 and TR2, which are needed in gate biasing circuit 100 as more particularly illustrated in FIG. 5 below, equivalent signals would need to be generated by other circuitry.

Figure 4:
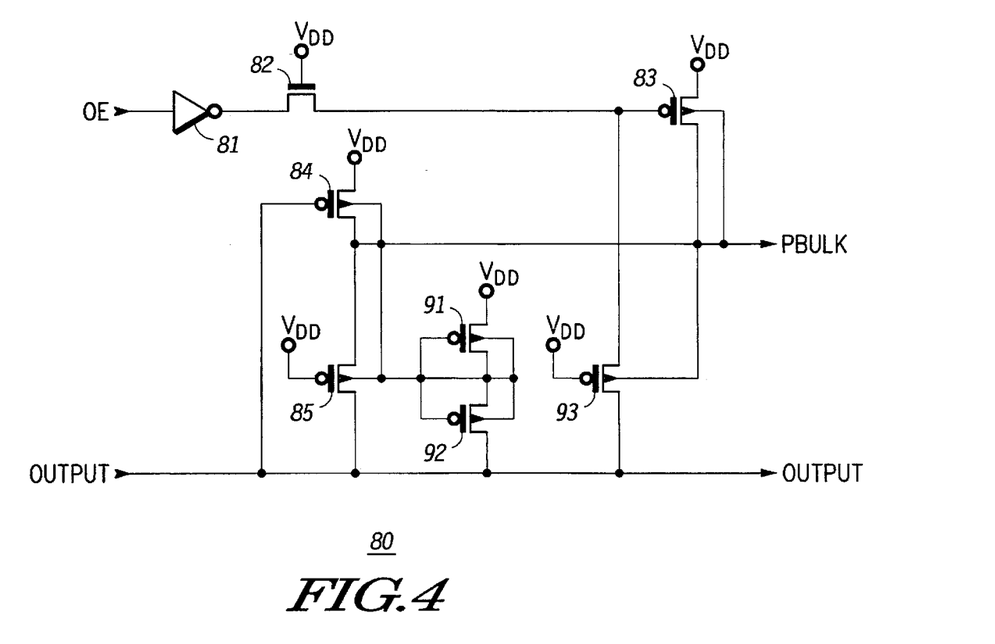
FIG. 4 illustrates in partial logic diagram and partial schematic form the bulk biasing circuit of FIG. 2.

FIG. 4 illustrates in partial logic diagram and partial schematic form bulk biasing circuit 80 of FIG. 2. Bulk biasing circuit 80 includes an inverter 81, an N-channel transistor 82, and P-channel transistors 83–85 and 91–93. Inverter 81 has an input terminal for receiving signal OE, and an output terminal. Transistor 82 has a first current electrode connected to the output terminal of inverter 81, a gate connected to $V_{DD}$, and a second current electrode. Transistor 83 has a source connected to $V_{DD}$, a gate connected to the second current electrode of transistor 82, a drain for providing signal PBULK, and a bulk connected to the drain thereof. Transistor 84 has a source connected to $V_{DD}$, a gate connected to the signal line conducting signal OUTPUT, a drain connected to the drain of transistor 83, and a bulk electrode connected to the drain of transistor 83. Transistor 85 has a source connected to the drain of transistor 84, a gate connected to $V_{DD}$, a drain connected to the signal line conducting signal OUTPUT, and a bulk electrode connected to the drain of transistor 83. Transistor 91 has a source connected to $V_{DD}$, a gate, a drain connected to the gate thereof and to the bulk electrodes of transistors 84 and 85, and a bulk electrode connected to the drain thereof. Transistor 92 has a source connected to the drain of transistor 91, a gate connected to the drain of transistor 91, a drain connected to the signal line conducting signal OUTPUT, and a bulk connected to the drain of transistor 91. Transistor 93 has a source connected to the second current electrode of transistor 82, a gate connected to $V_{DD}$, a drain connected to the signal line conducting signal OUTPUT, and a bulk electrode connected to the drain of transistor 83.

In operation, bulk biasing circuit 80 prevents reliability problems by adding another biasing condition to the switched well: if output buffer 30 is driving, then the bulk of transistor 71 is driven to the internal power supply voltage $V_{DD}$. If output buffer 30 is not driving, then signal PBULK is developed by transistors 84 and 85, and 91 and 92 such that the value of PBULK is driven either to the voltage of signal OUTPUT by transistor 85, or to $V_{DD}$ by transistor 84. Transistors 91 and 92 function to bias the bulks of transistors 84 and 85 to equal either $V_{DD}-V_{TP}$ if signal OUTPUT is less than or equal to $V_{DD}$, or OUTPUT–$V_{TP}$ if signal OUTPUT exceeds $V_{DD}+V_{TP}$. Transistor 93 prevents transistor 83 from being conductive when signal OUTPUT exceeds $V_{DD}+V_{TP}$, which prevents the high voltage of signal OUTPUT from sourcing current into $V_{DD}$.

Figure 5:
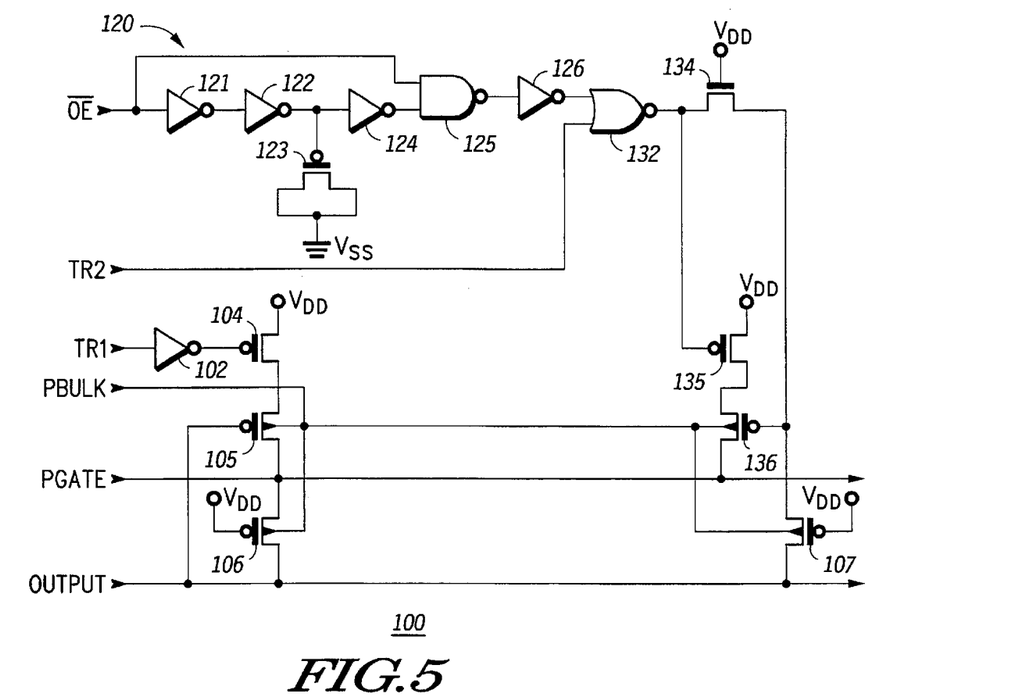
FIG. 5 illustrates in partial logic diagram and partial schematic form the gate biasing circuit of FIG. 2.

FIG. 5 illustrates in partial logic diagram and partial schematic form gate biasing circuit 100 of FIG. 2. Gate biasing circuit 100 includes generally an inverter 102, P-channel transistors 104–107, a one-shot 120, a NOR gate 132, an N-channel transistor 134, and P-channel transistors 135 and 136. Inverter 102 has an input terminal for receiving signal TR1, and an output terminal. Transistor 104 has a source connected to $V_{DD}$, a gate connected to the output terminal of inverter 102, and a drain. Transistor 105 has a source connected to the drain of transistor 104, a gate for receiving signal OUTPUT, a drain connected to the signal line conducting signal PGATE, and a bulk for receiving signal PBULK. Transistor 106 has a first current electrode connected to the drain of transistor 105, a gate connected to $V_{DD}$, a drain connected to the signal line conducting signal OUTPUT, and a bulk electrode for receiving signal PBULK. Transistor 107 has a first current electrode, a gate connected to $V_{DD}$, a second current electrode connected to the signal line conducting signal OUTPUT, and a bulk electrode for receiving signal PBULK.

One-shot 120 includes inverters 121 and 122, a P-channel transistor 123, an inverter 124, a NAND gate 125, and an inverter 126. Inverter 121 has an input terminal for receiving signal $\overline{OE}$, and an output terminal. Inverter 122 has an input terminal connected to the output terminal of inverter 121, and an output terminal. Transistor 123 has two current electrodes each connected to $V_{SS}$, and a gate connected to the output terminal of inverter 122. Inverter 124 has an input terminal connected to the output terminal of inverter 122, and an output terminal. NAND gate 125 has a first input terminal connected to the output terminal of inverter 124, a second input terminal for receiving signal $\overline{OE}$, and an output terminal. Inverter 126 has an input terminal connected to the output terminal of NAND gate 125, and an output terminal. Transistor 123 functions as a capacitor, and the output pulse of one-shot 120 has a width defined by the delay through inverters 121, 122, and 124, which includes the charging or discharging time of the capacitor formed by transistor 123.

NOR gate 132 has a first input terminal connected to the output terminal of inverter 126, a second input terminal for receiving signal TR2, and an output terminal. Transistor 134 has a first current electrode connected to the output terminal of NOR gate 132, a gate connected to $V_{DD}$, and a second current electrode connected to the first current electrode of transistor 107. Transistor 135 has a source connected to $V_{DD}$, a gate connected to the output terminal of NOR gate 132, and a drain. Transistor 136 has a source connected to the drain of transistor 135, a gate connected to the second current electrode of transistor 134, a drain connected to the signal line conducting signal PGATE, and a bulk electrode for receiving signal PBULK.

In operation, gate biasing circuit 100 functions to momentarily drive signal PGATE to a value of $V_{DD}$ when output buffer 30 stops driving. This condition is indicated by signal $\overline{OE}$ transitioning from a logic low to a logic high. This transition is captured by one-shot 120. When signal $\overline{OE}$ becomes a logic high, the first input of NAND gate 125 is a logic high. The second input of NAND gate 125 is also momentarily at a logic high, which makes its output a logic low and the output of inverter 126 a logic high. The logic high on signal $\overline{OE}$ makes the output of inverter 122 a logic high after two gate delays and this logic high begins to charge up the capacitor formed by transistor 123. Eventually, this node will charge up high enough to switch the output of inverter 124 to a logic low, which makes the output of NAND gate 125 a logic high. The length of the pulse out of one-shot 120 is determined by the delays through inverters 121, 122, and 124, and the capacitance of the capacitor formed by transistor 123. This length of time can be designed to be a certain amount through transistor sizing, but will vary with manufacturing process variations.

The output of one-shot 120 is combined (ORed) with signal TR2; if either signal TR2 is at a logic high or the output of one-shot 120 is at a logic high, then the output of NOR gate 132 is forced to a logic low. This logic low makes transistor 135 conductive, and transistor 134 conducts the logic low onto the gate of transistor 136 which makes it conductive as well. Therefore, gate biasing circuit 100 drives signal PGATE to a voltage of essentially $V_{DD}$. Transistor 134 functions to isolate NOR gate 132 from the higher voltage on signal PGATE.

There are other mechanisms for driving signal PGATE to a logic high. Inverter 102 in conjunction with transistors 104 and 105 function as a data controlled shutoff, which drives signal PGATE to $V_{DD}$ when signal TR1 is active at a logic high and signal OUTPUT is at a logic low. Transistor 106 functions to increase the voltage of signal PGATE to approximately the voltage of signal OUTPUT, when signal OUTPUT rises above $V_{DD}+V_{TP}$. Transistor 107 functions to couple the gate of transistor 136 to signal OUTPUT when the voltage of signal OUTPUT exceeds ($V_{DD}+V_{TP}$), thereby making transistor 136 nonconductive.

Figure 6:
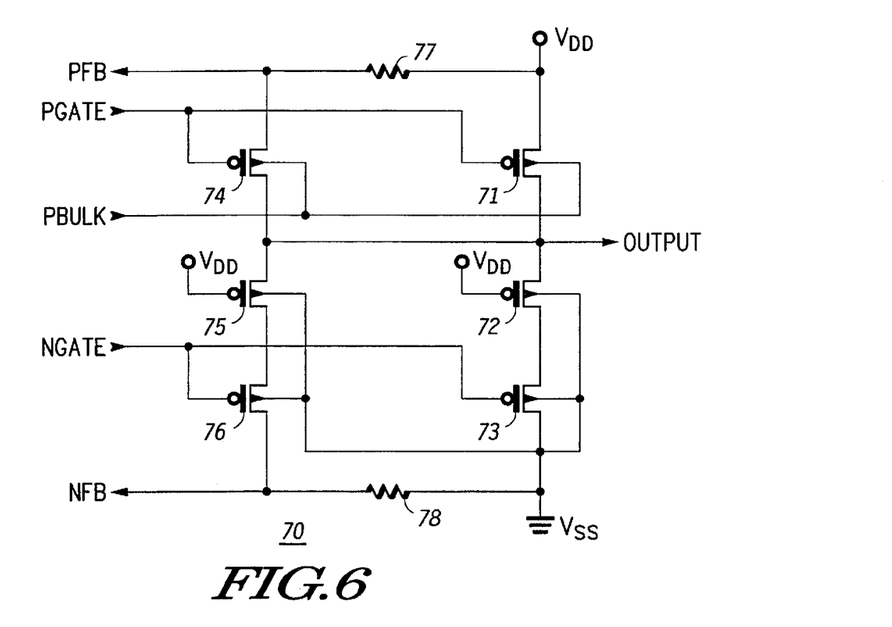
FIG. 6 illustrates in partial logic diagram and partial schematic form the output stage of FIG. 2.

FIG. 6 illustrates in partial logic diagram and partial schematic form output stage 70 of FIG. 2. Output stage 70 includes P-channel transistor 71, N-channel transistors 72 and 73, a P-channel transistor 74, N-channel transistors 75 and 76, and resistors 77 and 78. Transistors 71–73 are connected as described with reference to FIG. 2. Transistor 74 has a source connected through resistor 77 to $V_{DD}$, a gate for receiving signal PGATE, a drain for providing signal OUTPUT, and a bulk electrode for receiving signal PBULK. Transistor 75 has a drain connected to the drain of transistor 74, a gate connected to $V_{DD}$, a source, and a bulk electrode connected to $V_{SS}$. Transistor 76 has a drain connected to the source of transistor 75, a gate for receiving signal NGATE, a source connected through resistor 78 to $V_{SS}$, and a bulk electrode connected to $V_{SS}$. Resistor 77 has a first terminal connected to $V_{DD}$, and a second terminal for providing signal PFB. Resistor 78 has a first terminal connected to $V_{SS}$, and a second terminal for providing signal NFB.

In operation, output stage 70 includes the parallel connection of two buffers, the first of which is connected between $V_{DD}$ and $V_{SS}$, and the second of which is connected between PFB and NFB. Each stage contains an N-channel cascode device, transistors 72 and 75, respectively. The bulk electrodes of P-channel transistors 71 and 74 receive signal PBULK to prevent them from becoming occasionally forward biased, thereby reducing the possibility of circuit failure due to EOS. The bulk electrodes of N-channel transistors 72, 73, 75, and 76 are connected to in a conventional manner to $V_{SS}$ and therefore are biased by a good ground. Resistors 77 and 78 provide a voltage drop which is proportional to the current drawn through the second buffer, so that signals PFB and NFB depart from power supply voltages $V_{DD}$ and $V_{SS}$, respectively, during switching.

Note that bulk biasing and gate biasing circuits of the illustrated embodiment were connected to the "P" side of the output buffer because the more-negative power supply voltage, $V_{SS}$, is the common power supply voltage of the system and thus the more-positive power supply voltage $V_{DD}$ reflected differences in power supply between devices in the system. However this is not necessarily so, and in systems which use the emitter-coupled-logic (ECL) convention, the more-negative power supply voltage varies between devices and the more-positive power supply voltage is the common voltage of the system. In this case, mirror-image circuits applied to the "N" side of the output buffer will be necessary to prevent the EOS problem.

Figure 8:
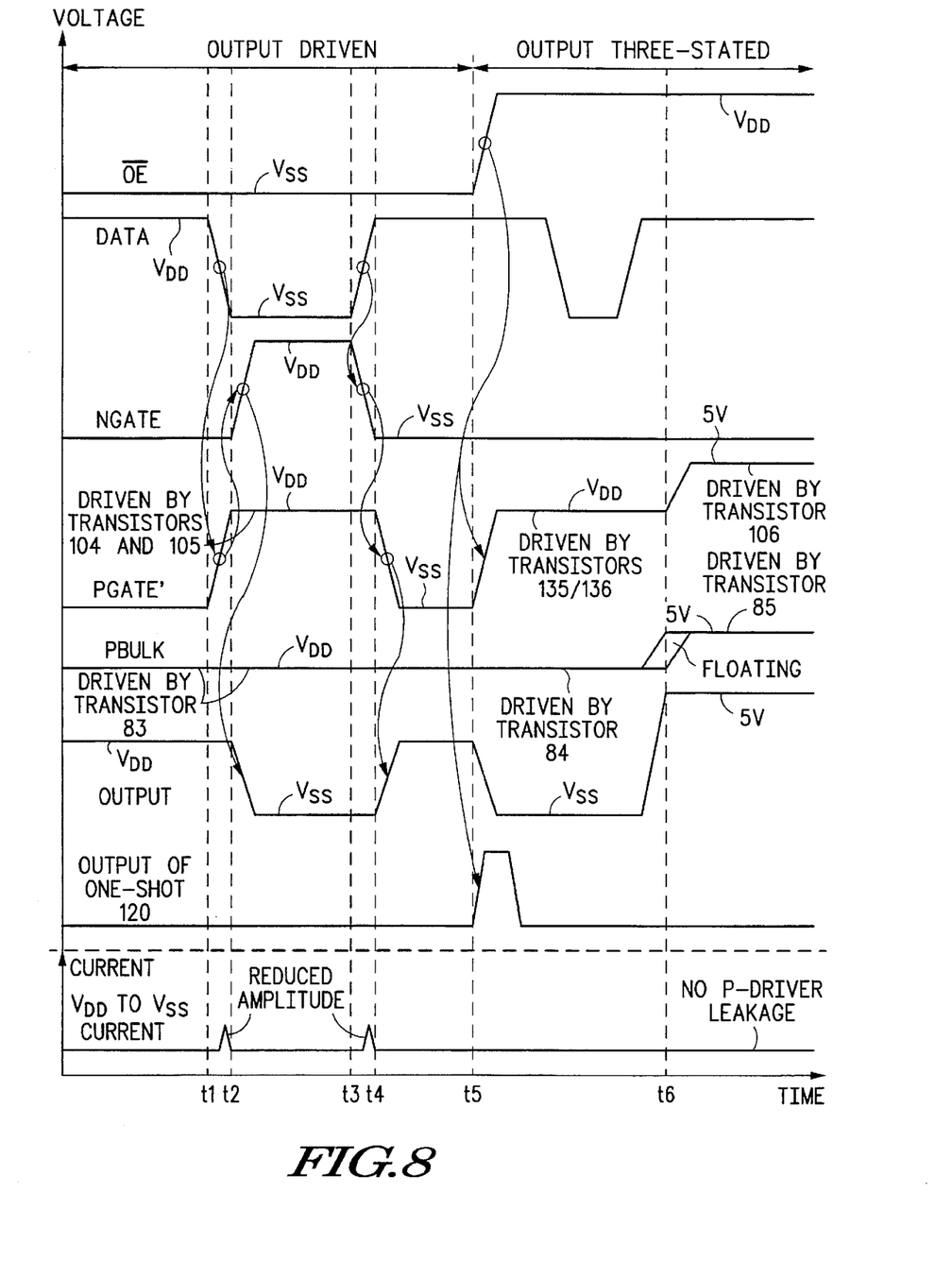
FIG. 8 illustrates a timing diagram useful in understanding the operation of the output buffer of FIG. 2.

FIG. 8 illustrates a timing diagram useful in understanding the present invention. Now considering FIG. 8 in conjunction with FIGS. 2–6, there are two relevant time periods. During a first time period which represents the period on the time axis up to time point t5, signal OUTPUT is driven, i.e., output buffer 30 is in an enabled condition, as indicated by signal $\overline{OE}$ being active at a logic low. After time point t5, signal $\overline{OE}$ transitions to a logic high, thereby causing output buffer 30 to enter a three-state condition, whereupon external circuitry may drive signal OUTPUT.

At time point t1, signal DATA transitions from a logic high to a logic low. This transition causes signal PGATE' to transition to a logic high, after which signal NGATE transitions to a logic high also due to the operation of non-overlapping circuit 60. Note in this case the logic high level of signal PGATE' attains a full CMOS logic level, because of the operation of transistors 104 and 105 in gate bias circuit 100. Note that signal PBULK is coupled to $V_{DD}$ during the entire time that signal $\overline{OE}$ is at a logic low. Signal OUTPUT transitions to a logic low by the activation of signal NGATE at time t2. Note the reduced amplitude $V_{DD}$-to-$V_{SS}$ current pulse which is caused by a lessened overlap current in transistors 71 and 73.

At time point t3, signal DATA transitions to a logic high. This transition causes signal NGATE to transition to a logic low, after which signal PGATE' transitions to a logic low also due to the operation of non-overlapping circuit 60. Signal OUTPUT transitions to a logic high by the activation of signal PGATE' at time t4. Again there is a reduced $V_{DD}$-to-$V_{SS}$ current pulse caused by the lessened overlap current in transistors 71 and 73.

At time point t5, signal $\overline{OE}$ transitions to a logic high, which causes signal NGATE to be inactive at a logic low regardless of the state of DATA. One-shot 120 provides a pulse which causes transistors 135 and 136 to drive signal PGATE' to substantially $V_{DD}$, thereby causing transistor 71 to become nonconductive. Thereafter, transistors 104 and 105 keep signal PGATE' nonconductive. Thus, despite signal OUTPUT being driven to a logic low by external circuitry, there is a no current pulse when output buffer 30 enters three-state. Nor is there the constant leakage through transistor 71 between the current pulses compared to transistor 21 of output buffer 20. Signal PBULK is driven to a voltage of $V_{DD}$ by transistor 84.

At time point t6, signal OUTPUT transitions to a voltage above $V_{DD}$, such as 5 volts in the illustrated example. This high voltage level is coupled to signal PGATE' by transistor 106. Once the gate of transistor 71 reaches this voltage, transistor 71 remains nonconductive, and there is still no $V_{DD}$-to-$V_{SS}$ leakage current. In addition, signal PBULK is likewise coupled to signal OUTPUT by transistor 85.

While the invention has been described in the context of a preferred embodiment, it will be apparent to those skilled in the art that the present invention may be modified in numerous ways and may assume many embodiments other than that specifically set out and described above. For example, a buffer according to the present invention is not limited to MOS or CMOS and may use any known transistor technology which uses field effects to create a conducting channel in a well or region of an opposite conductivity type. Also, the output buffer may form the output portion of an input/output buffer, and thus is not limited to output-only signals. Furthermore, other circuits could be used to produce the same functionality as the predriver, gate bias, and bulk bias circuit illustrated herein. Note that in addition to the circuitry illustrated in FIGS. 2–6, an actual output buffer may include additional circuit elements for other purposes, such as electrostatic discharge protection. Such additional circuitry has been omitted from the from the present discussion to ease the discussion of the present invention. Accordingly, it is intended by the appended claims to cover all modifications of the invention which fall within the true spirit and scope of the invention.

We claim:

1. A high reliability output buffer for a multiple voltage system comprising:

an enable input terminal for receiving an enable signal;

a predriver circuit having a data input terminal for receiving a data signal, a control input terminal coupled to said enable input terminal, and first and second output terminals for providing first and second predrive signals;

said predriver circuit providing first predrive at a logic state corresponding to said data signal when said enable signal is active, and providing said first predrive signal at a logic state corresponding to a first power supply voltage terminal when said enable signal is inactive;

said predriver circuit providing said second predrive signal at a logic state corresponding to said data signal when said enable signal is active, and providing said second predrive signal at a logic state corresponding to a second power supply voltage terminal when said enable signal is inactive;

a first transistor of a first conductivity type having a first current electrode coupled to said first power supply voltage terminal, a control electrode coupled to the first output terminal of said predriver circuit, a second current electrode for providing an output signal, and a bulk electrode;

a second transistor of a second conductivity type having a first current electrode coupled to said second current electrode of said first transistor, a control electrode for receiving said second predrive signal, and a second current electrode coupled to said second power supply voltage terminal; and a bulk biasing circuit having an input terminal coupled to said enable input terminal, and an output terminal coupled to said bulk of said first transistor, said bulk biasing circuit coupling said bulk electrode of said first transistor to said first power supply voltage terminal in response to said enable signal, wherein said bulk biasing circuit further has a second input terminal for receiving said output signal, and wherein said bulk biasing circuit further couples said bulk of said first transistor to said output signal when a voltage of said output signal exceeds a voltage of said first power supply voltage terminal by a predetermined amount.

2. The output buffer of claim 1 wherein said bulk biasing circuit comprises:

a third transistor having a first current electrode coupled to said first power supply voltage terminal, a control electrode for receiving said output signal, a second current electrode coupled to said bulk electrode of said first transistor, and a bulk electrode coupled to said second current electrode thereof; and a fourth transistor having a first current electrode for receiving said output signal, a control electrode coupled to said first power supply voltage terminal, a second current electrode coupled to said bulk electrode of said first transistor, and a bulk electrode coupled to said second current electrode of said third transistor.

3. The output buffer of claim 2 wherein said bulk biasing circuit further comprises:

a fifth transistor having a first current electrode coupled to said first power supply voltage terminal, a control electrode coupled to said second current electrode of said first transistor, a second current electrode coupled to said second current electrode of said first transistor, and a bulk electrode coupled to said second current electrode of said first transistor; and a sixth transistor having a first current electrode for receiving said output signal, a control electrode coupled to said second current electrode of said first transistor, a second current electrode coupled to said second current electrode of said first transistor, and a bulk electrode coupled to said second current electrode of said first transistor.

4. The output buffer of claim 1 further comprising a gate biasing circuit having an input terminal coupled to said enable input terminal, and an output terminal coupled to said control electrode of said first transistor, said gate biasing circuit coupling said control electrode of said first transistor to said first power supply voltage terminal for a predetermined time in response to an inactivation of said enable signal.

5. The output buffer of claim 4 wherein said gate biasing circuit comprises:

a one-shot having an input terminal coupled to said enable input terminal, and an output terminal for providing a shutoff pulse for said predetermined time; and logic means coupled to said output terminal of said one-shot and to said control electrode of said first transistor, for providing a voltage to said control electrode of said first transistor substantially equal to a voltage at said first power supply voltage terminal in response to said shutoff pulse.

6. A high reliability output buffer for a multiple voltage system comprising:

an enable input terminal for receiving an enable signal;

a predriver circuit having a data input terminal for receiving a data signal, a control input terminal coupled to said enable input terminal, and first and second output terminals for providing first and second predrive signals;

said predriver circuit providing first predrive at a logic state corresponding to said data signal when said enable signal is active, and providing said first predrive signal at a logic state corresponding to a first power supply voltage terminal when said enable signal is inactive;

said predriver circuit providing said second predrive signal at a logic state corresponding to said data signal when said enable signal is active, and providing said second predrive signal at a logic state corresponding to a second power supply voltage terminal when said enable signal is inactive;

a first transistor of a first conductivity type having a first current electrode coupled to said first power supply voltage terminal, a control electrode for receiving said first predrive signal, a second current electrode for providing an output signal, and a bulk electrode;

a second transistor of a second conductivity type having a first current electrode coupled to said second current electrode of said first transistor, a control electrode for receiving said second predrive signal, and a second current electrode coupled to said second power supply voltage terminal; and a gate biasing circuit having an input terminal coupled to said enable input terminal, and an output terminal coupled to said control electrode of said first transistor, said gate biasing circuit coupling said control electrode of said first transistor to said first power supply voltage terminal for a predetermined time in response to an inactivation of said enable signal.

7. The output buffer of claim 6 wherein said gate biasing circuit comprises:

a one-shot having an input terminal coupled to said enable input terminal, and an output terminal for providing a shutoff pulse for said predetermined time; and logic means coupled to said output terminal of said one-shot and to said control electrode of said first transistor, for providing a voltage to said control electrode of said first transistor substantially equal to a voltage at said first power supply voltage terminal in response to said shutoff pulse.

8. The output buffer of claim 6 further comprising:

a third transistor having a first current electrode coupled to said first output terminal of said predriver circuit, a control electrode coupled to said first power supply voltage terminal, and a second current coupled to said control of said first transistor.

9. The output buffer of claim 6 wherein said logic circuit comprises nonoverlapping circuit means for making said first and second predrive signals nonoverlapping with respect to each other.

10. The output buffer of claim 6 wherein said first current electrode of said second transistor is coupled to said second current electrode of said first transistor through a third transistor having a first current electrode coupled to said second current electrode of said first transistor, a gate coupled to said first power supply voltage terminal, and a second current electrode coupled to said first current electrode of said second transistor.

* * * * *